(12) United States Patent
Petereit et al.

(10) Patent No.: US 8,892,352 B2
(45) Date of Patent: Nov. 18, 2014

(54) METHOD FOR DETECTING A WORKING AREA AND DEVICE THEREFOR

(75) Inventors: Steffen Petereit, Freiberg (DE); Amos Albert, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 106 days.

(21) Appl. No.: 13/643,942

(22) PCT Filed: Feb. 28, 2011

(86) PCT No.: PCT/EP2011/052871
§ 371 (c)(1),
(2), (4) Date: Jan. 8, 2013

(87) PCT Pub. No.: WO2011/134696
PCT Pub. Date: Nov. 3, 2011

(65) Prior Publication Data
US 2013/0154688 A1 Jun. 20, 2013

(30) Foreign Application Priority Data
Apr. 27, 2010 (EP) .......................... 10 2010 028 251

(51) Int. Cl.
*G01C 21/00* (2006.01)
*H03K 5/22* (2006.01)
*A01K 15/02* (2006.01)
*G05D 1/02* (2006.01)

(52) U.S. Cl.
CPC .......... *H03K 5/22* (2013.01); *G05D 2201/0201* (2013.01); *G05D 2201/0203* (2013.01); *A01K 15/023* (2013.01); *G05D 1/0265* (2013.01); *G05D 2201/0215* (2013.01); *G05D 2201/0208* (2013.01)
USPC ............................. 701/408; 701/29.8; 701/36

(58) Field of Classification Search
CPC .................... G05D 2201/0201; A01K 15/023; A47L 11/4011; A47L 11/4061
USPC .............. 701/2, 29.8, 30.7, 36, 408; 340/10.1
See application file for complete search history.

(56) References Cited

U.S. PATENT DOCUMENTS

| 3,299,351 A | 1/1967 | Williams |
| 3,407,895 A | 10/1968 | Hasenbalg |

(Continued)

FOREIGN PATENT DOCUMENTS

| DE | 1 613 991 | 8/1970 |
| DE | 1 902 037 | 8/1970 |

(Continued)

OTHER PUBLICATIONS

International Search Report corresponding to PCT Application No. PCT/EP2011/052871, mailed Jun. 30, 2011 (German and English language document) (7 pages).

(Continued)

*Primary Examiner* — Gertrude Arthur Jeanglaude
(74) *Attorney, Agent, or Firm* — Maginot, Moore & Beck LLP (57) ABSTRACT

A method for detecting a position with respect to a mobile working machine includes providing a current signal in a boundary conductor, which surrounds the defined area, in accordance with a boundary signal that is provided, the boundary signal corresponding to a pseudo-accident signal; and receiving a detection signal of a magnetic field. The method further includes generating a reconstructed boundary signal from the detection signal; providing a reference signal which has a bit pattern corresponding to the boundary signal provided; carrying out a correlation method in order to determine a time-based correlation offset between the reference signal and the reconstructed boundary signal and a correlation value between the reference signal and the reconstructed boundary signal, which are displaced in relation to each other by the correlation offset determined; and determining a position inside or outside the defined area as a function of the correlation value determined.

12 Claims, 5 Drawing Sheets

(56) References Cited

U.S. PATENT DOCUMENTS

| | | | |
|---|---|---|---|
| 3,550,714 | A | 12/1970 | Bellinger |
| 3,570,227 | A | 3/1971 | Bellinger |
| 5,438,266 | A | 8/1995 | Tsang |
| 2008/0168950 | A1 | 7/2008 | Moore |

FOREIGN PATENT DOCUMENTS

| | | | |
|---|---|---|---|
| DE | 2 228 659 | | 1/1974 |
| EP | 1 025 472 | B1 | 8/2000 |
| EP | 1 047 983 | B1 | 11/2000 |
| EP | 1 470 460 | B1 | 10/2004 |
| EP | 1 512 053 | B1 | 3/2005 |
| EP | 1 612 631 | A2 | 1/2006 |
| EP | 1 906 205 | A1 | 4/2008 |
| WO | 90/00274 | A1 | 1/1990 |

OTHER PUBLICATIONS

Transmitted GPS Signals, kowoma.de, Apr. 19, 2009, pp. 1-3, XP002642236.

Prigge et al., Signal Architecture for a Distributed Magnetic Local Positioning System, IEEE Sensors Journal, Dec. 2004, vol. 4, No. 6, pp. 864-873, IEEE Service Center, New York, NY, XP011122381.

Gorostiza et al., A Local Positioning System Based on Pseudo-Random Sequence Emission, 15th Triennial World Congress of the IFAC, Barcelona, Spain, Dec. 31, 2002, pp. 1-4, XP55000746.

METHOD FOR DETECTING A WORKING AREA AND DEVICE THEREFOR

This application is a 35 U.S.C. §371 National Stage Application of PCT/EP2011/052871, filed on Feb. 28, 2011, which claims the benefit of priority to Serial No. DE 10 2010 028 251.0, filed on Apr. 27, 2010 in Germany, the disclosures of which are incorporated herein by reference in their entirety.

BACKGROUND

The disclosure relates to devices which automatically detect their location with respect to a defined area and perform a function when a boundary of the defined area is reached or crossed. For example, such devices may be mobile working devices such as automatic or semi-automatic ground treatment machines, for example lawnmowers and the like.

Automatic or semi-automatic mobile working devices, for example ground treatment machines, for example lawnmowers, are generally intended to automatically move inside a defined working area without leaving the latter. An outer boundary of the working area may be determined, for example, by an electrical boundary conductor.

An electrical current flows through the boundary conductor which marks the outer boundary of the working area. The resultant electrical or magnetic field may be detected by a suitable sensor in the mobile working device, with the result that the working device can perform a function upon approaching the boundary of the working area. In the case of automatic mobile working devices, provision may be made, for example, for the mobile working device to turn or reverse in order to thus avoid leaving the working area.

In a simple embodiment, an electrical alternating current flows through the boundary conductor. The mobile working device is provided with detection coils in which an AC voltage is induced by the alternating magnetic field generated around the boundary conductor. Upon approaching the current-carrying boundary conductor, the magnetic field strength of the alternating field increases, as a result of which the amplitude of the induced AC voltage increases. Upon reaching a defined threshold for the amplitude of the induced AC voltage, the mobile working device is instructed to move away from the boundary of the working area. If the boundary conductor is crossed, the direction of the alternating magnetic field is reversed and the phase angle of the induced AC voltage thus changes, with the result that the mobile working device can use the phase change to discern whether it is inside or outside the working area.

The documents U.S. Pat. No. 3,550,714, U.S. Pat. No. 3,570,227, U.S. Pat. No. 549,674, U.S. Pat. No. 3,407,895, DE 16 13 991 and DE 19 02 037 disclose simple operating area boundaries for mobile working devices, which are based on measuring the signal strength of a signal emitted by a boundary conductor. However, a disadvantage of these systems is that it is not possible to detect on what side of the current-carrying boundary conductor the corresponding detection coil is located, that is to say whether the working device is inside or outside the defined working area. In particular, with this method, it is not possible to determine whether the working device is inside or outside the working area when the mobile working device is switched on.

In the case of systems which have been developed further, as known, for example, from the documents WO 90/00274, EP 1 025 472, EP 1 047 983, DE 2 228 659, U.S. Pat. No. 3,299,351 and U.S. Pat. No. 5,438,266, provision is made for the boundary conductor to have superimposed alternating currents at two or more than two frequencies. If the frequencies of the alternating currents are multiples of one another and their temporal relationship with respect to one another is known, the sum signal can be used to determine on what side of the boundary conductor the mobile working device is located.

The document EP 1 470 460 describes a system which is able, to a limited extent, to detect whether the detection coils in the mobile working device are inside or outside a current-carrying boundary conductor. For this purpose, the amplitudes of the currently detected signals are compared with the previous amplitudes. A microprocessor carries out a numerical analysis in order to determine the number of measurements which is needed to reach a threshold value and which is a measure of the distance to the boundary conductor. The numerical analysis makes it possible to detect a phase change when the boundary conductor is crossed. A further possible way of detecting when the boundary conductor is crossed may involve comparing the signals from two detection coils which are fastened to the mobile working device at different positions. This makes it possible to detect a phase shift as a result of the boundary conductor being crossed.

The documents EP 1 512 053 and EP 1 906 205 each describe a system in which periodic current pulse trains flow through the boundary conductor. The magnetic field generated by the current pulse train is detected by suitable sensors and the resultant voltage signals are evaluated over time.

The disadvantage of the systems described above is that it is necessary to impress alternating currents at two or more than frequencies on the boundary conductor and to carry out a temporal evaluation of the signals which is triggered by a current pulse.

The document EP 1 612 631 describes a system which can carry out an evaluation without a current trigger signal. However, with this system, it is necessary to switch on the mobile working device while it is inside the working area. After the mobile working device has been switched on, a clock in the working device is synchronized with the signal from the boundary conductor. As a result, the working device can detect phase changes when the boundary conductor is crossed.

The object of the present disclosure is to provide a device and a method for operating a device, the device being able to detect whether it is inside or outside a defined area, without previously learning what area it is located in, for example as early as immediately after being switched on.

SUMMARY

This object is achieved by the method for detecting a position with respect to a defined area according to claim 1 and by the device, the boundary device and the system according to the coordinate claims.

Further advantageous refinements are specified in the dependent claims.

A first aspect provides a method for detecting a position with respect to a defined area, in particular in a mobile working device. The method comprises the following steps of:
 providing a current signal in a boundary conductor, which surrounds the defined area, according to a boundary signal which has been provided, the boundary signal corresponding to a pseudo-random signal;
 receiving a detection signal from a magnetic field generated by the current signal in the boundary conductor;
 generating a reconstructed boundary signal from the detection signal;

providing a reference signal having a bit pattern corresponding to the boundary signal which has been provided;
carrying out a correlation method in order to determine a temporal correlation offset between the reference signal and the reconstructed boundary signal and in order to determine a correlation value between the reference signal and the reconstructed boundary signal which have been shifted with respect to one another by the correlation offset which has been determined;
determining a position inside or outside the defined area on the basis of the correlation value which has been determined.

Another aspect provides a method for detecting a position with respect to an area defined by an alternating magnetic field. The method comprises the following steps of:
receiving a detection signal which corresponds to a voltage induced by the alternating magnetic field;
generating a reconstructed boundary signal from the detection signal;
providing a reference signal, the reconstructed boundary signal and the reference signal corresponding to a pseudo-random signal;
carrying out a correlation method in order to determine a temporal correlation offset between the reference signal and the reconstructed boundary signal and in order to determine a correlation value between the reference signal and the reconstructed boundary signal which have been shifted with respect to one another by the offset which has been determined;
determining a position inside or outside the area on the basis of the correlation value which has been determined.

One idea of the above method is that, like in the previous systems, the working area is delimited by a boundary conductor. A current signal is impressed on the boundary conductor and generates a corresponding alternating magnetic field. The current signal is generated from a boundary signal which has been provided and corresponds to a random periodic signal sequence. The signal sequence of the boundary signal is known to the device. The reference signal is synchronized with the reconstructed boundary signal or vice versa with the aid of a correlation method in the device. Upon determining that the boundary signal and the reference signal are correlated, it is detected whether a device is inside or outside a particular area defined by the boundary conductor.

The above method has the advantage that the reconstructed boundary signal can be correlated with a reference signal with little computational complexity in a mobile device, with the result that it is possible to detect whether the mobile device is inside or outside an area defined by a boundary conductor. This applies, in particular, as early as when the device is switched on, without the need for previous learning.

Pseudo-random signals which have very favorable frequency spectrum properties are preferably used as the transmission signal, thus resulting in a very high degree of reliability of the method even under interference-intensive environmental conditions. Furthermore, these signals can be generated in a simple manner, for example with the aid of a shift register and logic gates, for example an exclusive-OR gate.

In particular, another advantage is that there is no need to learn what area the device is located in immediately after the device has been switched on. A check is only carried out, by using the correlation method, in order to determine whether or not the received reconstructed boundary signal and the reference signal are correlated. If there is correlation, the device can detect whether the device is inside the area. In addition, it is advantageous that the transmitted boundary signal is permanently transmitted, with the result that any interference is superimposed.

In addition, the implementation of correlation methods does not impose any stringent requirement on the evaluation electronics, and it is possible to impress a smaller current on the boundary conductor than is the case in the previously implemented systems. This is because small magnetic field strengths of the magnetic field generated by the impressed currents can be accepted owing to the fault tolerances of the correlation methods.

Furthermore, the pseudo-random signal may be a binary signal with a quasi-random sequence of levels and may correspond to a periodic bit pattern which is selected in such a manner that a length of a section of the periodic bit pattern, which is identical to a section of the inverted bit pattern of the same length, undershoots a predefined part of the total length of the bit pattern.

Furthermore, the boundary signal may correspond to a gold code.

According to one embodiment, the temporal correlation offset between the reference signal and the reconstructed boundary signal may be determined by determining a plurality of correlation values for different temporal offsets and by determining the temporal correlation offset as the temporal offset for the correlation value of the largest magnitude.

The correlation value may be determined with the aid of a cross-correlation function by adding or multiplying samples of the reconstructed boundary signal and time values of the reference signal.

Another aspect provides a device, in particular a mobile working device. The device comprises:
a detector unit for receiving a detection signal from a magnetic field generated by the current signal in the boundary conductor;
a reference signal generator for providing a reference signal which has a bit pattern corresponding to the boundary signal which has been provided;
an evaluation unit which is designed
to generate a reconstructed boundary signal from the detection signal,
to carry out a correlation method in order to determine a temporal correlation offset between the reference signal and the reconstructed boundary signal and in order to determine a correlation value between the reference signal and the reconstructed boundary signal which have been shifted with respect to one another by the offset which has been determined; and
to determine a position inside or outside the area on the basis of the correlation value which has been determined.

Another aspect provides a boundary signal generator for providing a current signal in a boundary conductor, which surrounds a defined area, according to a boundary signal which has been provided, the boundary signal corresponding to a pseudo-random signal.

Another aspect provides a system for detecting a position with respect to an area. The system comprises:
a boundary conductor which surrounds the area;
the above device, and
the above boundary signal generator which injects a current signal into the boundary conductor.

Another aspect provides a computer program product containing a program code which carries out the above method when executed on a data processing unit.

Another aspect provides a use of the above system in a mobile working device, in which a movement of the mobile working device is allowed only inside the area and in which the direction of the mobile working device is changed upon reaching the boundary conductor.

Another aspect provides a use of the above system in a monitoring device, in which a function of the monitoring device is triggered upon leaving the area.

Another aspect provides a use of the above system in a tracking device, in which the tracking device changes direction in the direction of the boundary conductor if the position of the tracking device is detected as being inside or outside the area.

BRIEF DESCRIPTION OF THE DRAWINGS

Preferred embodiments are explained in more detail below using the accompanying drawings, in which.

DETAILED DESCRIPTION

The disclosure generally relates to devices which can detect whether they are inside or outside a defined area. In particular, these devices may be mobile working devices or monitoring devices.

Mobile working devices may be, for example, automatic or semi-automatic working devices for ground treatment and may undertake tasks, for example lawn mowing, scarifying, aerating, collecting leaves, watering the garden, fertilizing the garden/lawn, clearing snow and, in the domestic sector, vacuuming, wiping floors, washing floors, polishing floors and the like. In the industrial sector, the ground treatment tasks may include preparing icy surfaces and vacuuming/wiping/washing/polishing floors in halls and the like.

In alternative embodiments, the device may also be in the form of a monitoring device in order to monitor whether a person, an animal or an item moves from a predefined monitoring area, with the result that said device is suitable, for example, for applications with respect to a virtual fence for pets, for theft protection of devices, for example vehicles, or for an electronic tag.

The disclosure is described below using an automatic mobile working device.

Figure 1:
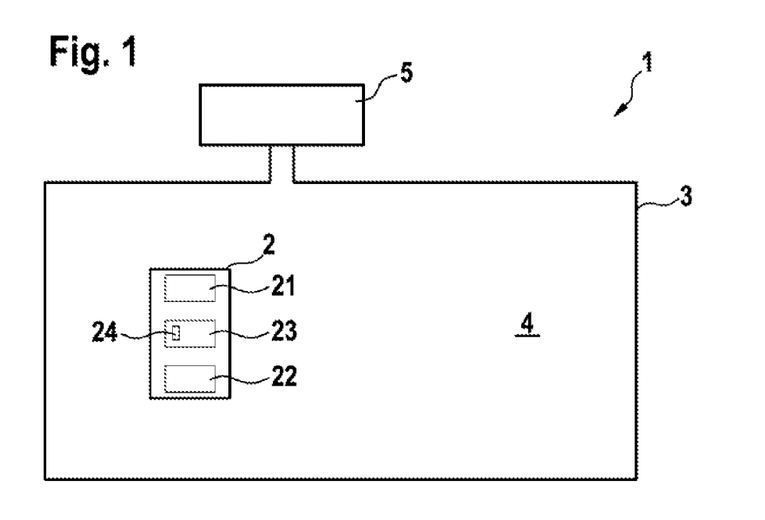
FIG. 1 shows a schematic illustration of a system having a mobile working device for ground treatment inside a working area.

FIG. 1 shows, as one possible embodiment, a system 1 having a mobile working device 2 which is inside a working area 4 defined by a boundary conductor 3.

The boundary conductor 3 is preferably set into the ground or fastened on the latter. The boundary conductor 3 is in the form of a conductor loop and defines, in its interior, a working area 4 which is not intended to be left by the mobile working device. If the mobile working device reaches the boundary conductor 3, a function is intended to be performed. This function may be, for example, the reversal of the direction of travel or a change of direction.

The boundary conductor 3 is connected to a boundary signal generator 5 which injects a boundary signal BS, as a current signal, into the conductor loop of the boundary conductor 3. As described below, the boundary signal is generated as a sequence of preferably binary signal levels according to a boundary signal frequency generated by a boundary signal oscillator 51.

The current flow of the current signal results in an alternating magnetic field forming around the boundary conductor 3, the strength and direction of which field depend on the current intensity and direction of the boundary signal. On account of the loop form of the boundary conductor 3, the direction of the alternating magnetic field is rectified in the entire interior of the working area 4 surrounded by the boundary conductor and, outside the working area surrounded by the boundary conductor 3, is phase-shifted through 180° with respect to the alternating magnetic field.

The mobile working device 2 comprises a detector unit 21 in order to detect the alternating magnetic field generated by the boundary conductor 3 and the direction of said field. The detector unit 21 is usually formed with the aid of one or more induction coils in which an electrical voltage is induced on the basis of the alternating magnetic field generated by the current signal injected into the boundary conductor 3. This induced voltage is referred to as the detection signal below.

The detection signal is carried out an evaluation unit 22. The evaluation unit 22 analyzes the detection signal from the detector unit 21 and uses the detection signal to generate the boundary signal BS injected into the boundary conductor 3. Since induction coils can only detect changes in the magnetic field as a voltage peak, the voltage peaks are therefore interpreted in the evaluation unit 22 as a level change signal according to their sign. If the boundary signal BS which is injected into the boundary conductor 3 is a binary current signal, any voltage peak of the detection signal can be interpreted as a level change. In this manner, the evaluation unit 22 reconstructs the applied boundary signal in the mobile working device 2 and provides this signal as a reconstructed boundary signal.

The mobile working device 2 also comprises a reference signal generator 23 which generates a reference signal which, in terms of the signal sequence, substantially corresponds to the boundary signal predefined by the boundary signal generator 5. For this purpose, the reference signal generator 23 comprises a reference signal oscillator 24 which provides, for the reference signal, the same base frequency as that provided by the boundary signal oscillator 51 in the boundary signal generator 5 for the purpose of generating the boundary signal. The reference signal is not synchronized with the boundary signal on the boundary conductor 3, at least at the time at which the mobile working device 2 is switched on.

Figure 2:
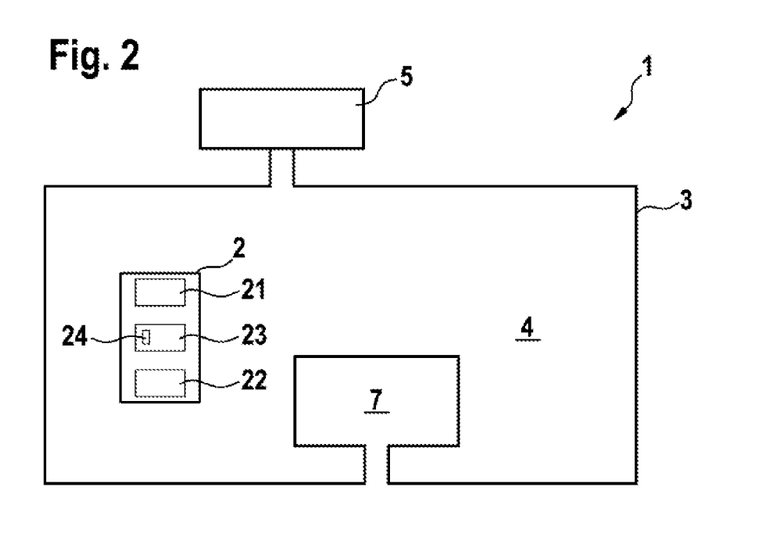
FIG. 2 shows a schematic illustration of another embodiment of a system having a mobile working device in a working area which is formed by a plurality of boundary conductor loops inside one another.

FIG. 2 illustrates a further configuration of the working area 4 in which an island area 7 is provided inside the working area 4 and is considered to be an area outside the working area 4 for the mobile working device 2. If, as illustrated in that section 8 of the boundary conductor 3 which connects the island area to the outer edge of the working area 4, two sections of the boundary conductor 3 are close together, this is substantially invisible to the detection unit 21 of the mobile working device 2 since the current directions in these two sections are generally opposite when the boundary conductor 3 is formed in a conductor loop and the alternating magnetic fields generated thereby cancel each other out.

The boundary signal generator 5 and the reference signal generator 23 in the mobile working device 2 substantially generate an identical signal which, as a pseudo-random signal, consists of a pseudo-random sequence of a predefined number of bits. The pseudo-random signal is periodically provided. The pseudo-random signal is also referred to as PRN (pseudo-random noise) or PRBS (pseudo-random binary signal). The pseudo-random signals generated in the boundary signal generator 5 and in the reference signal generator 23 are not synchronized with one another and there is no explicit starting time or a starting pattern.

Figure 3A:
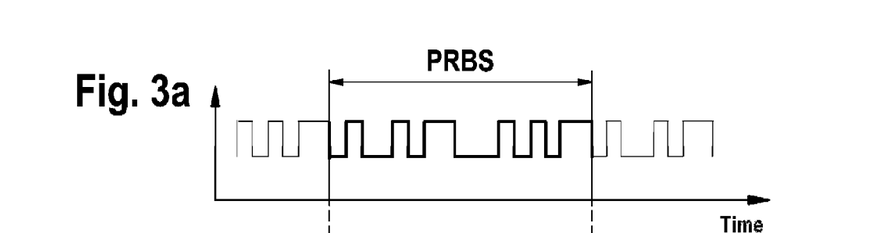
FIG. 3 shows an illustration of the temporal profiles of the boundary signal generated by the boundary conductor and of a boundary signal reconstructed by the evaluation unit of the mobile working device and of the reference signal generated by the reference signal generator of the mobile working device.

FIG. 3 illustrates exemplary profiles of a boundary signal, a reference signal and a reconstructed boundary signal which is received by the detector unit 21 and has interference. FIG. 3a shows a boundary signal which is generated by the boundary signal generator 5 and is converted into a corresponding current signal which is injected into the boundary conductor 3. The profile of the alternating magnetic field generated by the flow of current substantially corresponds to a profile of the boundary signal.

Figure 3B:
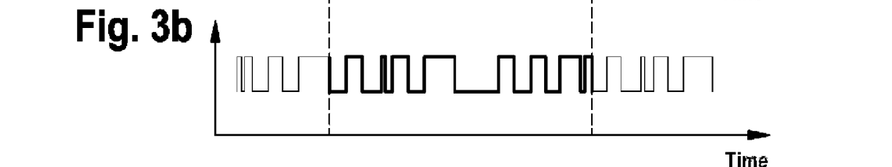

FIG. 3b shows a corresponding reconstructed boundary signal which is generated from the detection signal in the detection unit 21 of the mobile working device 2 and has interference. It is seen that the detection signal substantially corresponds to the boundary signal and that there is no significant offset between the boundary signal and the detection signal.

Figure 3C:
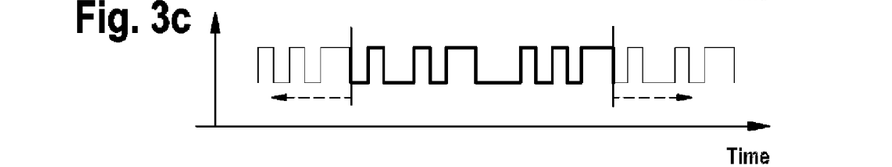

FIG. 3c illustrates a reference signal as is generated in the reference signal generator 23. The reference signal generator 23 generates the reference signal in the same manner as the boundary signal generator 5, with the result that the same sequence of bits at the same signal frequency as the boundary signal is provided.

Figure 4:
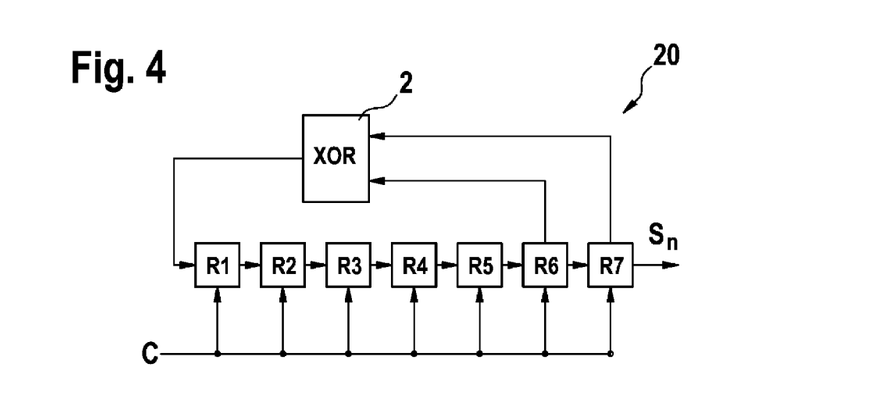
FIG. 4 shows a block diagram of a signal generator for generating a pseudo-random signal with the aid of a shift register.

Pseudo-random signals can be generated in a simple manner, for example by using a linearly coupled shift register 20 (linear feedback shift register), as illustrated in the block diagram in FIG. 4, for example. A series circuit comprising seven latches 21 (register circuits), that is to say a first latch to a seventh latch which are connected in series in the form of a shift register 20, is seen. The shift register 20 is clocked by a clock signal C, with the result that the input of each of the latches 21 is applied to its output upon an edge of the clock signal C. The outputs of two of the latches 21, here the sixth latch and the seventh latch, are fed back to an exclusive OR gate 22, the output of which is connected to the input of the first latch 21. Such a connection results in a serial 128-bit random pattern at the output of the seventh latch 21, given a particular starting state, without signal patterns being completely repeated within this bit pattern. These pseudo-random signal sequences are called gold codes. Such a circuit can also be used to periodically repeat the sequence of the 128-bit pseudo-random signal without resulting in petering out.

The important factor for the pseudo-random signals is that, if the random bit pattern is periodically repeated, no sections of the pseudo-random signal are identical to sections of the inverse pseudo-random signal in which logic levels of the pseudo-random signal are respectively inverted. The length of that section of the bit pattern which is identical to the inverse pseudo-random signal must not exceed a predefined amount based on the length of the overall bit pattern since otherwise sufficient discrimination by means of the correlation is not possible.

An exemplary 5-bit shift register of the same design allows gold codes each with a signal length of 31 bits. These gold codes may be predefined, for example, with the aid of so-called DIP switches in the signal generators in order to thus individualize the tuning between the boundary signal generator 5 and the reference signal generator 23, in particular if a plurality of mobile working devices of the same design are used in a manner close together. The longer the shift register 20, the more suitable random signal patterns can be distinguished. In principle, many different possible ways of generating such repeating random signal patterns which can be used in the described device are conceivable.

Figure 5:
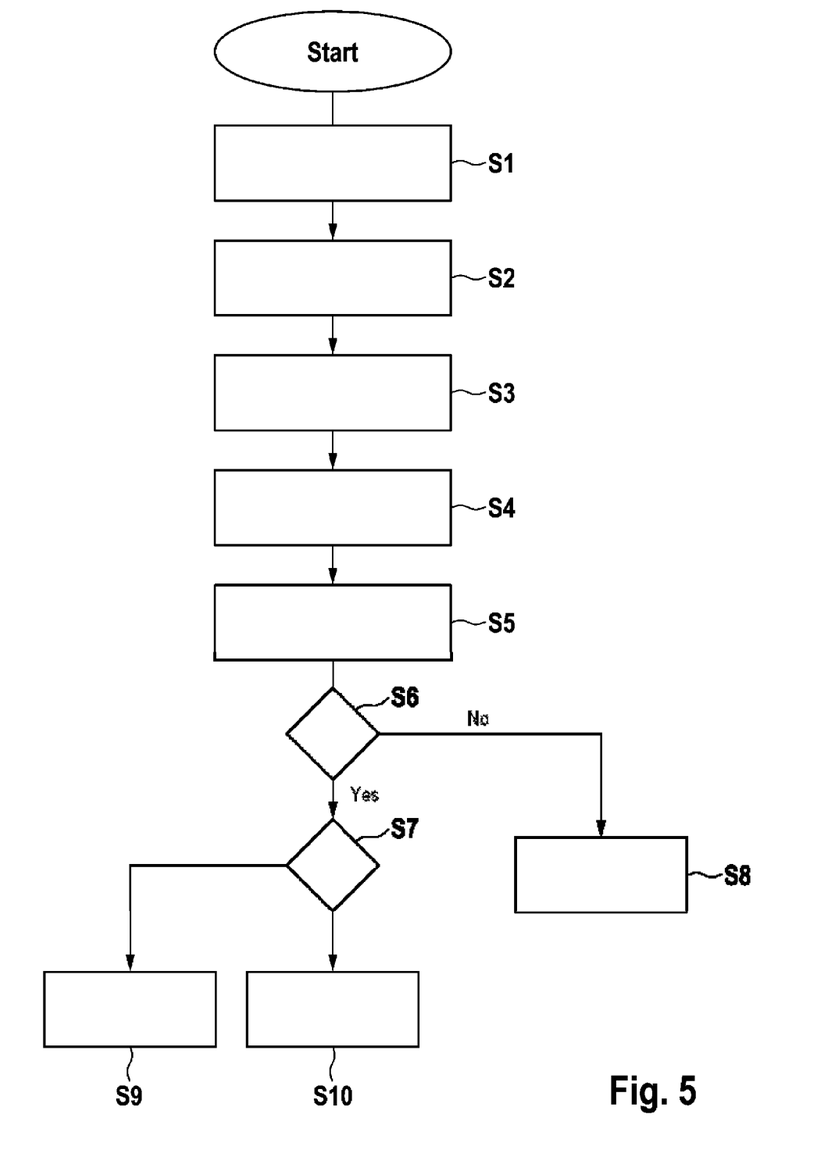
FIG. 5 shows a flowchart for illustrating the method for detecting an area.

The method for detecting the area in which the working device is located is described below in conjunction with the flowchart in FIG. 5.

After the detection signal has been received by the detection unit 21 in step S1, the evaluation unit 22 receives, in step S2, the detection signal received by the detection unit 21 and converts it into the reconstructed boundary signal in step S3. According to step S4, the reference signal is generated by the reference signal generator 23. In step S5, the reconstructed boundary signal is correlated with the reference signal generated by the reference signal generator 23 in the evaluation unit 22. Since the reference signal and the boundary signal are generated by the same random function, in particular by the same hardware, for example in the form of the shift register 20, the pseudo-random signal is identical and periodic. When an identical oscillator frequency is used to generate the pseudo-random signals, the pseudo-random signals can thus be correlated with one another. Step S6 thus queries whether there is correlation, that is to say the reference signal RS and the reconstructed boundary signal BS can be correlated with one another. If this is the case (alternative: yes), the working device 2 is tuned to the boundary signal generator 5. A subsequent check of the correlation value in step S7 determines whether the working device 2 is inside (step S9) or outside the working area 4 (step S10), which is signaled in a suitable manner or results in particular functions being carried out or retained (retention of the direction of movement, reversal of direction). If there is no correlation (alternative: no) according to step S6, that is to say the reference signal RS and the reconstructed boundary signal BS cannot be correlated with one another, an emergency function, for example stopping of the working device, is triggered in step S8.

Figure 6:
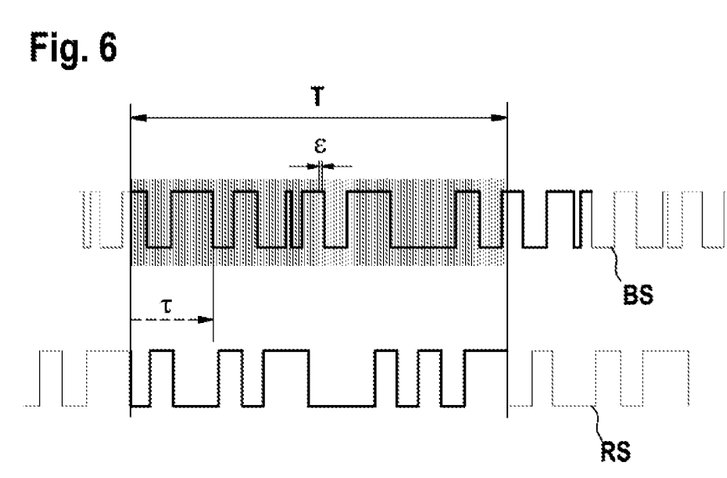
FIG. 6 shows an illustration of the temporal profiles of the reconstructed boundary signal and of the reference signal.

For the purpose of correlation, the reference signal and the reconstructed boundary signal are sampled at a higher frequency, for example four times to ten times the oscillation frequency of the signal generators. The sampling of the reconstructed boundary signal BS and of the reference signal RS is illustrated in FIG. 6 as a temporal profile of the signals.

The samples of the boundary signal BS(i) and of the reference signal RS(i) are compared with one another for the purpose of synchronization and a cross-correlation function value KKF is determined according to the following formula:

$$KKF(\tau) = \frac{1}{N}\sum_{i=0}^{N-1} \overline{XOR}(RS(i), BS(i-\tau))$$

where i corresponds to a sampling time.

The cross-correlation values KKF are determined for a plurality of signal shifts in which the two signals are shifted with respect to one another by integer multiples of a sampling period ϵ, which indicates the period between the sampling operations, and the cross-correlation values KKF are calculated again.

Figure 7A:
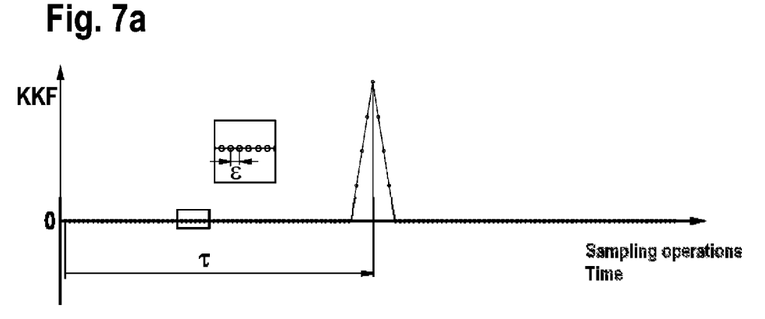
FIGS. 7a to 7c show different combination results for a 5-bit pseudo-random signal, illustrated against the sampling shift E, for the situation in which the working device is inside the working area, for the situation in which the working device is outside the working area and for the situation in which no reception signal is received or the reconstructed boundary signal has different coding from the reference signal.
Figure 7B:
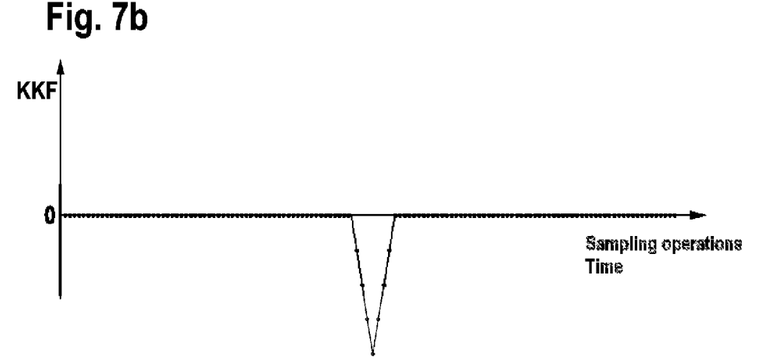
Figure 7C:
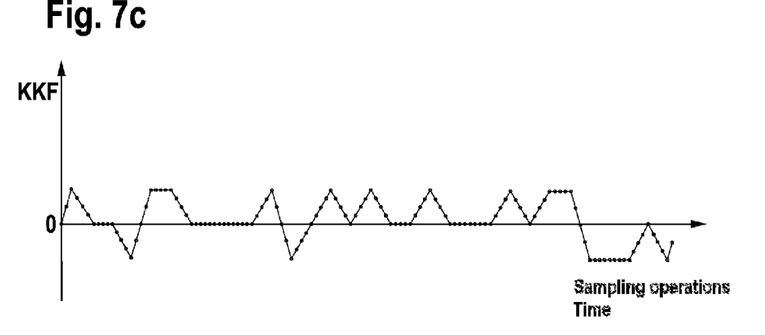

As illustrated in FIGS. 7a-7c, cross-correlation values KKF result for different temporal offsets between the detection signal DS and the reference signal RS, as illustrated in FIGS. 7a-7c, where N=T/ϵ results from the number N of sampling operations during a period T of the boundary signal.

It is noted that the correlation can also be calculated in another manner, for example by multiplying the reference signal value RS and the detection signal value DS at a particular sampling time or, for example, by adding the reconstructed boundary signal and the reference signal and subsequently smoothing the result of the addition.

The cross-correlation value KKF corresponds to the so-called sum result and is also referred to as a score. Whenever RS(i) and BS(i−T) are identical, the summand is the value 1 and otherwise is the value 0.

In order to obtain a relative measure of the cross-correlation value KKF, the result of the summation is divided by the number N of sampling operations. The above correlation function results in a value of approximately 1 if the mobile working device 2 is inside the working area 4 defined by the boundary conductor 3. If the mobile working device 2 is outside the working area 4, the alternating magnetic field generated by the boundary conductor 3 has an opposite direction (phase shift of 180°), with the result that the reconstructed boundary signal BS for corresponding signal parts has a negative sign in comparison with inside the working area 4. In this case, the reconstructed boundary signal is inversely correlated with the reference signal and a cross-correlation value of −1 is obtained in this manner.

Since interference may arise when receiving the detection signal, the cross-correlation value determined by the above cross-correlation function may not exactly correspond to 1 or −1, but rather may have values which differ therefrom, depending on whether one or more bits of the pseudo-random boundary signal do not correspond to the pseudo-random reference signal. For this reason, in order to determine whether there is correlation or inverse correlation, the cross-correlation value is not compared with 1 or −1, but rather a check is carried out in order to determine whether the corresponding cross-correlation value KKF is within a predefined tolerance range around 1 or −1. If the cross-correlation value KKF is within the defined tolerance range, correlation is determined and it is thus determined that the mobile working device 2 is inside the working area or outside the working area.

In FIGS. 7a to 7c, cross-correlation values KKF are plotted against different temporal offsets. It is seen that a maximum (in FIG. 7a) or a minimum (in FIG. 7b) of the cross-correlation value KKF is reached with a particular temporal offset. If it is possible to determine a maximum or minimum of this type whose cross-correlation value KKF is above a predefined positive correlation threshold value determined by the tolerance range, for example 0.8 or 0.9, or below a negative correlation threshold value determined by the tolerance range, for example −0.8 or −0.9, the corresponding temporal offset represents the phase shift between the reconstructed boundary signal BS and the reference signal RS.

If the correlation value determined does not exceed the positive correlation threshold value or if the cross-correlation value KKF determined does not undershoot the negative correlation threshold value, it can be determined that the boundary signal BS has different coding from the reference signal RS or that no wire signal is received. Such a case is illustrated in the graph in FIG. 7c.

If the shift τ is determined by the position of the cross-correlation KKF, the reference signal RS generated in the mobile working device 2 can now be shifted by T, with the result that the two signals, that is to say the reconstructed boundary signal BS and the reference signal RS, are synchronous.

However, it is necessary to permanently adapt the synchronization since the oscillators for signal generation and evaluation possibly do not provide an exactly identical base frequency. This is effected with the aid of so-called secondary correlators around which the main correlator is respectively shifted by k×ϵ, where k= . . . −3, −2, −1, 0, 1, 2, 3 . . . .

For the evaluation, recourse is had to stored values of the two signals without a large amount of effort. The main correlator results according to the rule $$KKF(0) = \frac{1}{N}\sum_{i=0}^{N-1} \overline{XOR}(RS(i), BS^*(i))$$

where the main correlator with BS* corresponds to the original boundary signal shifted by τ. The secondary correlators are determined according to the rule $$KKF(k*\varepsilon) = \frac{1}{N}\sum_{i=0}^{N-1} \overline{XOR}(RS(i), BS^*(i - k*\varepsilon))$$

where k= . . . −3, −2, −1, 0, 1, 2, 3 . . . .

In order to have carried out all correlations after the expiry of a full period, it may be expedient to shift the individual correlation functions with respect to one another (for example for a shift of k=−2 here)

$$KKF(-2) = \frac{1}{N}\sum_{i=0}^{N-1} \overline{XOR}(RS(i), BS(i+2)) \approx \frac{1}{N}\sum_{i=-2}^{N-3} \overline{XOR}(RS(i), BS(i+2))$$

By comparing the results from the correlators, for example by searching for a maximum or by considering a threshold value, a time shift which has occurred can be detected and a corresponding correction of τ can be carried out. The correction can be carried out at defined points in time or at regular intervals of time.

When the mobile working device passes from inside the working area to an area outside the working area or vice versa, it is conceivable for intermediate values to arise or for the positive or negative correlation threshold values not to be reached during correlation. For this case, provision may be made for no correction to be carried out. On account of the high sampling rate, individual failures may be tolerated.

If there are no valid correlation results over a predefined period of time (range of k), that is to say the cross-correlation values KKF are outside the tolerance ranges defined by the correlation threshold values, a new pass is carried out in order to find the correlation between the reconstructed boundary signal BS and the reference signal RS, as described above. If correlation between the two signals still cannot be determined, a corresponding emergency function can be carried out, for example switching off the mobile working device, in order to ensure the safety of the overall system.

The boundary system described above can also be used for the operation of a semi-automatic working device. This may be, for example, a manually moved lawnmower which, for example, switches off the mower as soon as the evaluation unit on the device determines that the working area has been left.

Apart from bounding work areas, the above-described arrangement for determining whether the working device is inside or outside an area can also be used to guide the mobile working device along the boundary conductor, for example the tracking of the boundary conductor by the device.

The invention claimed is:

1. A method for detecting a position with respect to a defined area comprising:
providing a current signal in a boundary conductor, which surrounds the defined area, according to a boundary signal which has been provided, the boundary signal corresponding to a pseudo-random signal;
receiving a detection signal from a magnetic field generated by the current signal in the boundary conductor;
generating a reconstructed boundary signal from the detection signal;
providing a reference signal having a bit pattern corresponding to the boundary signal which has been provided;
identifying a maximum magnitude correlation in a plurality of correlations between the reference signal and the reconstructed boundary signal, each correlation in the plurality of correlations being performed with one temporal offset in a plurality of temporal offsets between the reference signal and the reconstructed boundary signal; and
determining a position inside of the defined area in response to the maximum magnitude correlation being a positive value that is greater than a predetermined positive correlation threshold or another position outside of the defined area in response to the maximum magnitude correlation being a negative value that is less than a predetermined negative correlation threshold.

2. A method for detecting a position with respect to an area defined by an alternating magnetic field, comprising:
receiving a detection signal which corresponds to a voltage induced by the alternating magnetic field;
generating a reconstructed boundary signal from the detection signal;
providing a reference signal, the reconstructed boundary signal and the reference signal corresponding to a pseudo-random signal;
identifying a maximum magnitude correlation in a plurality of correlations between the reference signal and the reconstructed boundary signal, each correlation in the plurality of correlations being performed with one temporal offset in a plurality of temporal offsets between the reference signal and the reconstructed boundary signal; and
determining a position inside of the area in response to the maximum magnitude correlation being a positive value that is greater than a predetermined positive correlation threshold or outside of the area in response to the maximum magnitude correlation being a negative value that is less than a predetermined negative correlation threshold.

3. The method as claimed in claim 2, wherein the pseudo-random signal is a binary signal with a quasi-random sequence of levels and corresponds to a periodic bit pattern which is selected in such a manner that a length of a section of the periodic bit pattern, which is identical to a section of the inverted bit pattern of the same length, undershoots a predefined part of the total length of the bit pattern.

4. The method as claimed in claim 2, wherein the boundary signal corresponds to a gold code.

5. The method as claimed in claim 2, wherein the maximum magnitude correlation is determined with the aid of a cross-correlation function by adding or multiplying samples of the reconstructed boundary signal and time values of the reference signal.

6. The method as claimed in claim 2, wherein a computer program product contains a program code which carries out the method when executed on a data processing unit.

7. A device, comprising:
a detector unit configured to receive a detection signal from a magnetic field generated by the current signal in a boundary conductor;
a reference signal generator configured to provide a reference signal which has a bit pattern corresponding to the boundary signal which has been provided; and
an evaluation unit which is configured (i)
to generate a reconstructed boundary signal from the detection signal,
to identify a maximum magnitude correlation in a plurality of correlations between the reference signal and the reconstructed boundary signal, each correlation in the plurality of correlations being performed with one temporal offset in a plurality of temporal offsets between the reference signal and the reconstructed boundary signal; and
to determine a position inside of an area defined by the boundary conductor in response to the maximum magnitude correlation being a positive value that is greater than a predetermined positive correlation threshold or outside the area in response to the maximum magnitude correlation being a negative value that is less than a predetermined negative correlation threshold.

8. The device of claim 7, further comprising:
a boundary signal generator configured to provide a current signal in the boundary conductor according to a boundary signal which has been provided, the boundary signal corresponding to a pseudo-random signal.

9. The device of claim 8 wherein:
the device is part of a system for detecting a position with respect to the area, and
the system includes (i) the boundary conductor which surrounds the area, (ii) the device, and (iii) the boundary signal generator, which injects a current signal into the boundary conductor.

10. The device as claimed in claim 9, wherein:
the device is used in a mobile working device, and
a movement of the mobile working device is allowed only inside the area and in which the direction of the mobile working device is changed upon reaching the boundary conductor.

11. The device as claimed in claim 9, wherein:
the device is used in a monitoring device, and
a function of the monitoring device is triggered upon leaving the area.

12. The device as claimed in claim 9, wherein:
the device is used in a tracking device, and
the tracking device changes direction in the direction of the boundary conductor if the position of the tracking device is detected as being inside or outside the area.

* * * * *